United States Patent [19]
Simons

[11] Patent Number: 4,749,937
[45] Date of Patent: Jun. 7, 1988

[54] PHASE DETECTOR INDEPENDENT OF CLOCK DUTY-CYCLE

[75] Inventor: Johannes M. M. Simons, Venlo, Netherlands

[73] Assignee: Oce-Nederland B.V., Venlo, Netherlands

[21] Appl. No.: 879,377

[22] Filed: Jun. 27, 1986

[30] Foreign Application Priority Data

Jul. 1, 1985 [NL] Netherlands ..................... 8501887

[51] Int. Cl.⁴ ............................................. G01R 25/00
[52] U.S. Cl. .................................. 324/83 D; 375/110
[58] Field of Search ............. 324/83 D; 307/511, 517, 307/525, 526, 527, 510, 514, 516; 328/133, 134 US, 155 US; 375/82, 110

[56] References Cited

U.S. PATENT DOCUMENTS

| | | | |
|---|---|---|---|
| 4,527,277 | 7/1985 | Kosaka et al. ....................... | 375/82 |
| 4,599,570 | 7/1986 | Cloke .................................. | 307/511 |
| 4,668,917 | 5/1987 | Levine ................................. | 328/155 |

Primary Examiner—Michael J. Tokar
Assistant Examiner—Louis M. Arana
Attorney, Agent, or Firm—Reed Smith Shaw & McClay

[57] ABSTRACT

An improved phase detector for generating a measurement signal indicating the extent to which the actual distance ($\tau$) between the flanks of data pulses generated for serial data transmission and the detection times determined by a detection clock differs from a required distance (Tg). The phase detector generates on every flank of a data signal a first pulse and a second pulse by means of two D-flipflops controlled by the detection clock. The width of the first pulse is equal to the period of the clock cycle T. The width of the second pulse is equal to the distance between the flank of the data signal and the next following flank of the clock signal. The amplitudes of the first pulse and the second pulse are adjusted and then are fed to a differential amplifier. The adjustment is such that the ratio between the amplitude of the first pulse and the amplitude of the second pulse is equal to Tg/T. Thus, the average value of the output signal of the differential amplifier is a measure of the difference between the actual distance ($\tau$) and the required distance Tg.

3 Claims, 3 Drawing Sheets

PHASE DETECTOR INDEPENDENT OF CLOCK DUTY-CYCLE

BACKGROUND OF THE INVENTION

1. Field of the Invention

The present invention relates to a phase detector for generating a measurement signal indicating the extent to which the actual distances between data pulses generated for serial data transmission and the detection times determined by a detection clock differ from a required distance.

2. Description of the Prior Art

European Patent Application No. 54,322 discloses a phase detector for generating a measurement signal indicating the extent to which the actual distances between data pulses generated for serial data transmission and the detection times determined by a detection clock differ from a required distance. In this phase detector, a reference pulse is delivered whose width is equal to half the clock cycle. The reference signal is fed to a controlled current source which generates a first current. A detection signal is fed to a second controlled current source which generates a second current whose value should equal the first current if the actual distance equals the required distance. The first current is subtracted from the second current to obtain a differential current which is a measure of the difference between the actual distance and the required distance.

To generate the reference signal in the phase detector of European Patent Application No. 54,322, the output of a first flipflop is connected to the input of a second flipflop. The second flipflop is controlled by a clock signal 180° phase-shifted with respect to the phase of the clock signal which controls the first flipflop. Thus, over a time period equal to half the cycle of the clock signal, the second flipflop output signal is shifted with respect to the first flipflop output signal. Both the output of the first flipflop and the output of the second flipflop are fed to an exclusive OR-gate which generates a reference pulse at each flank of a data pulse.

In this device, the width of the reference pulse depends on the duty-cycle of the clock signal. In the case of a reference signal having a pulse width equal to half the cycle of the clock signal, a duty-cycle of 50% is required. It would be desirable, however, to provide a phase detector whose proper operation is independent of the duty-cycle of the clock signal supplied.

Similary, in European Patent Application No. 10,959, an output of a first flipflop and an output of a second flipflop are fed to an exclusive OR-gate before being fed to additional circuit elements which include another exclusive OR-gate and a flipflop which can toggle on a clock pulse. As shown in the timing diagram of FIG. 3, the output of the exclusive OR-gate is dependent upon and related to the duty-cycle of the clock signal. Thus, this device not only has the disadvantages of clock duty-cycle dependency but it also requires more circuit elements.

SUMMARY OF THE INVENTION

Generally, the present invention provides an improved phase detector for generating a measurement signal indicating the extent to which the actual distance ($\tau$) between the flank (i.e. leading and/or trailing edge) of a data pulse generated for serial data transmission and the detection time determined by a detection clock signal differs from a required distance (Tg) wherein the operation of the phase detector is independent of the duty-cycle of the clock signal supplied. After detection of a flank of a data pulse, the phase detector of the present invention generates a detection signal whose pulse width corresponds to the actual distance ($\tau$). The phase detector is provided with an exclusive OR-gate and a first D-flipflop controlled by a detection clock. The data pulses are fed to the D-input of the first flipflop and the first input of the exclusive OR-gate, while the output signal of the D-fliflop, which functions as detected data, is fed to the second input of the exclusive OR-gate. The output of the exclusive OR-gate is the detection signal.

After detection of a flank of a data pulse, a reference signal pulse is generated by means of a second D-flipflop. The reference signal pulse width is derived from the detection signal and is a measure of the required distance (Tg). The difference between the detection signal and the reference signal is determined by means of a subtraction circuit to generate a measurement signal.

The D-input of the second flipflop in the phase detector of the present invention is connected to the output of the exclusive OR-gate. The clock inputs of the first and second flipflops are directly interconnected. The output signal of the second flipflop functions as a reference signal. Moreover, the phase detector also has at least one adjustment circuit by means of which the amplitude of either the detection signal or of the reference signal or both are varied before the signals are fed to the subtraction circuit so that the ratio between the amplitude of the reference signal and the amplitude of the detection signal after adjustment is equal to Tg/T where T is the time period of the clock cycle.

In response to a data pulse flank, a reference signal having a pulse width equal to the cycle of the clock signal is always fed to the output of the second flipflop. Before the reference signal and the detection signal are fed to the subtraction circuit, they are adjusted so that the average value of the output signal of the subtraction circuit is equal to 0 if the difference between the actual distance and the required distance is equal to 0. The second flipflop, used for determining the reference pulse, is controlled by the same clock signal as the first flipflop so that proper operation of the phase detector is obtained irrespective of the clock signal duty-cycle. Also, the second exclusive OR-gate used in the prior art phase detectors has become superfluous for generation of the reference signal, thereby reducing the number of components.

The present invention provides for an improved phase detector for generating a measurement signal indicating the extent to which the actual distance ($\tau$) between the flanks of data pulses generated for serial data transmission and the detection times determined by a detection clock differs from a required distance (Tg). The improved phase detector generates on every flank of a data signal a first pulse and a second pulse by means of two D-flipflops controlled by the detection clock. The width of the first pulse is equal to the period of the clock cycle. The width of the second pulse is equal to the distance between the flank of the data signal and the next following flank of the clock signal. The amplitudes of the first pulse and the second pulse may be varied and then are fed to a differential amplifier. The adjustment is such that the ratio between the amplitude of the first pulse and the amplitude of the second pulse is equal to Tg/T. Thus, the average value of the output signal of the differential amplifier is a measure of the difference between the actual distance ($\tau$) and the required distance Tg.

Other features and advantages of the present invention will be apparent from the following detailed description and with reference to the accompanying drawings.

DESCRIPTION OF THE PREFERRED EMBODIMENTS

Figure 1:
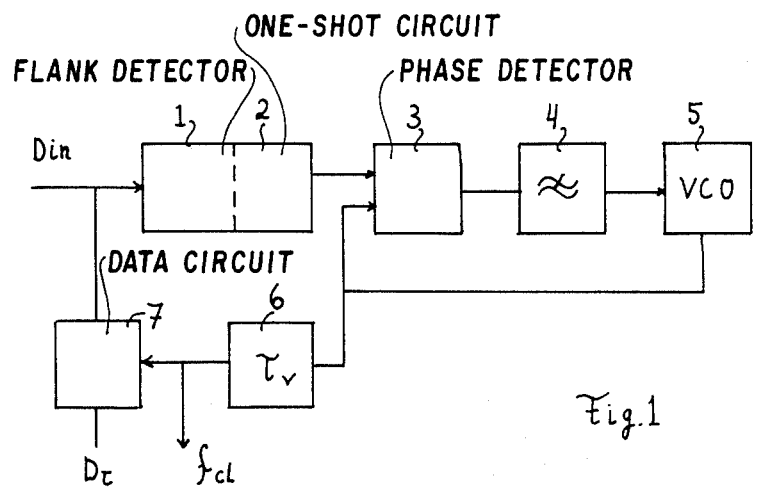
FIG. 1 is a diagram of a generally known phase-lock-loop circuit (PLL) with an arbitrary phase detector.

Referring to the phase-lock-loop circuit shown in FIG. 1, the data input signal $D_{in}$ is fed to a flank detector circuit 1 which delivers a signal pulse if a flank is detected. The signal is then fed to a one-shot circuit 2. In a multiplier acting as a phase detection element 3, the phase of the data signal is compared with the regenerated clock signal originating from a voltage controlled oscillator (VCO) 5. The control voltage obtained from phase detection element 3 is fed via loop filter 4 to voltage controlled oscillator 5 which is tuned to the clock frequency. As a result of the phase detection in element 3, the nonlinear processing in flank detector circuit 1 and, possibly, as a result of time delays, an extra adjustable delay circuit 6 is often required to position the phase of the regenerated clock signal $f_{CL}$ in the middle of a bit cell for the purpose of optimum detection of the data in circuit 7. Since both flank detector circuit 1 and delay circuit 6 are frequency-dependent, frequency deviations may also cause deviations in the detection time. Elements 1, 2, 3, 6 and 7 form the phase detector of the prior art phase-lock-loop circuit shown in FIG. 1.

Figure 2:
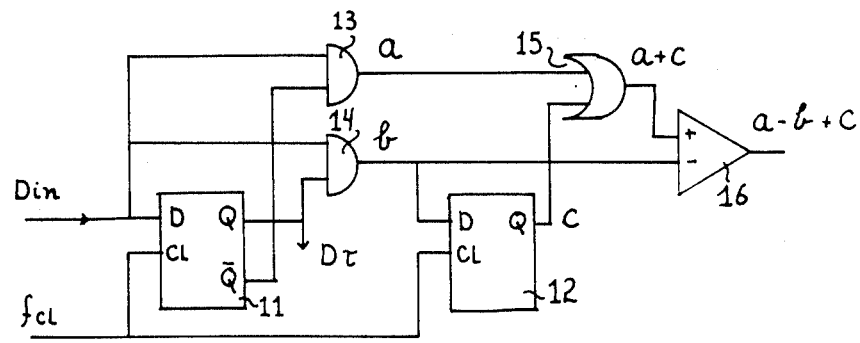
FIG. 2 is a diagram of a phase detector in which phase information is derived from two consecutive flanks of the data.
Figure 3:
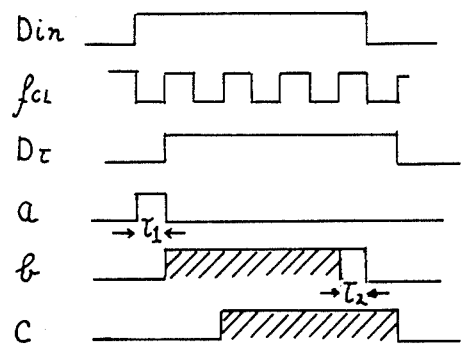
FIG. 3 is a timing diagram of some of the signals occurring in the phase detector of FIG. 2.

FIG. 2 represents a phase detector used in place of elements 1, 2, 3, 6 and 7 of FIG. 1 which adjusts the phase of the regenerated clock to the middle of the data bit cell by making the distance $\tau_1$ between a flank in the data and the following detection time (positive clock flank) equal to the distance $\tau_2$ between the following flank and the preceding detection time (positve clock flank). This phase detector has two D-type flipflops 11 and 12, two AND-gates 13 and 14, an OR-gate 15 and a differential amplifier 16. FIG. 3 shows some wave forms of signals occurring in the phase detector of FIG. 2.

The data input signal $D_{in}$ in the phase detector of FIG. 2 is fed to the D-input of flipflop 11 and to AND-gates 13 and 14. The clock signal $f_{CL}$ regenerated by the phase-lock-loop circuit is fed to the clock input CL of flipflop 11 and flipflop 12, respectively. The data signal $D_T$ to be regarded as the detected data signal is fed from the Q(set) output of flipflop 11 to AND-gate 14, and the inverted data signal is fed from the $\overline{Q}$(reset) output to AND-gate 13. Output signal b of AND-gate 14 is fed to the D-input of flipflop 12 and to the minus input of differential amplifier 16. The Q output signal c of flipflop 12 and the output signal a of AND-gate 13 are fed to the two inputs of OR-gate 15. the OR-gate output signal a+c is fed to the plus input of differential amplifier 16. The output control voltage of differential amplifier 16 is equal to $a-b+c=\tau_1-\tau_2$ since, as shown in FIG. 3, the hatched areas of b and c cancel one another out upon subtraction. The output control voltage is fed to loop filter 4. The control is such that $\tau_1$ is made equal to $\tau_2$ in which case the optimum detection time falls exactly in the middle of the data bit cell. In this phase detector, the phase information is obtained from two consecutive flanks of the data, a positive flank and a negative flank.

Figure 4:
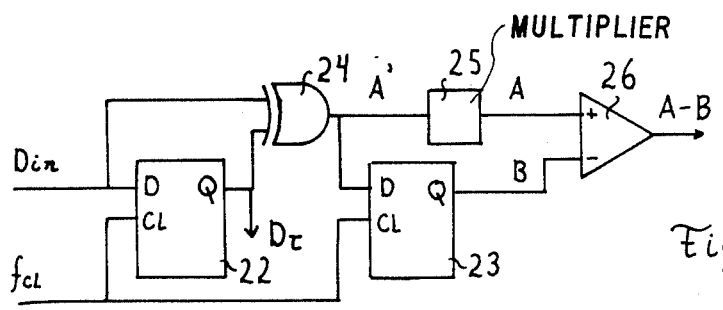
FIG. 4 is a diagram of a phase detector according to the present invention.

FIG. 4 represents a phase detector according to the present invention in which a complete phase measurement is carried out for each flank of the data. In this phase detector which can be used in place of elements 1, 2, 3, 6 and 7 of FIG. 1, the distance between a flank in the data and the following detection time is made equal to half the period of the clock cycle T so that both the distance $\tau$ and the clock cycle T are measured.

Figure 5:
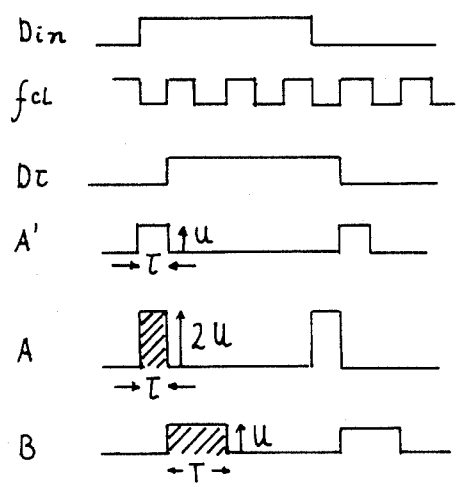
FIG. 5 is a timing diagram of some of the signals occuring in the phase detector of FIG. 4.

The phase detector shown in FIG. 4 is constructed using only a few elements. The elements are two D-type flipflops 22 and 23, an exclusive OR-gate 24, a factor-2 multiplier 25 and a differential amplifier 26. FIG. 5 shows some wave forms of signals occurring in the phase detector of FIG. 4. As can be seen in FIG. 5, the actual distance ($\tau$) between a data pulse flank and the clock signal on a time scale is also a measure of the phase difference and lack of synchronism between the data pulse and the clock signal.

The data input signal $D_{in}$ is fed to the D-input of flipflop 22 and to one input of exclusive OR-gate 24. The clock signal $f_{CL}$ regenerated by the phase-lock-loop circuit is fed to the clock inputs CL of both flipflops 22 and 23. The data signal $D_T$ taken from the Q(set) output of flipflop 22 is fed to the other input of exclusive OR-gate 24. The output signal A' of exclusive OR-gate 24 is fed to multiplier 25 and to the D-input of flipflop 23. The output signal A of multiplier 25 and the output signal B of the Q(set) output of flipflop 23 are fed to the plus input and the minus input, respectively, of differential amplifier 26.

At each flank in the data, there appears at the input of multiplier 25 a pluse A' with a width $\tau$ and a height u. At the Q(set) output of flipflop 23, there then appears a pulse B with a width T, equal to one clock cycle, and a height u. When $\tau = \frac{1}{2}T$, the areas of the two pulses A and B can be made equal by multiplying the pulse A' by $2 : 2 \times u \times \tau = u \times T$. If $\tau$ deviates from $\frac{1}{2}T$, the output of differential amplifier 26 delivers a control voltage $A - B$ which controls the phase-lock-loop circuit via the loop filter 4.

Figure 6A:
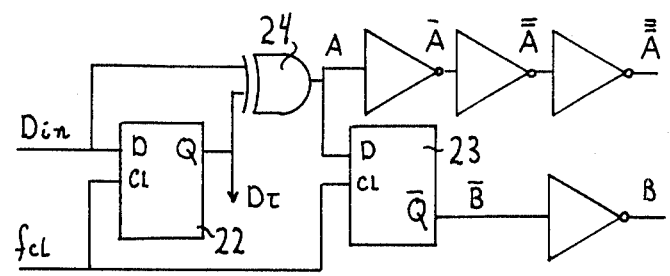
FIGS. 6a and 6b are diagrams of a preferred embodiment of the phase detector shown in FIG. 4.
Figure 6B:
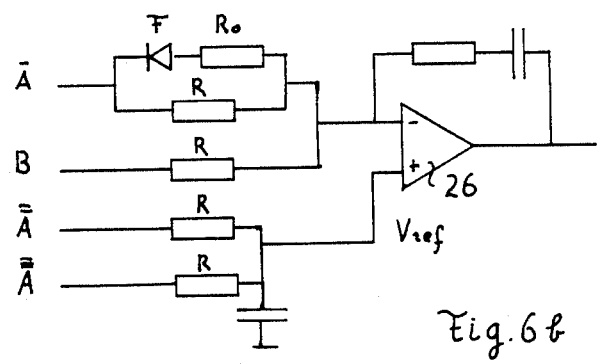

FIGS. 6a and 6b represent a preferred embodiment of the phase detector shown in FIG. 4. FIG. 6a includes a plurality of inverters used to form the input signal $A+B$ and the reference voltage $V_{ref}$ which are fed to differential amplifier 26 (see FIG. 6b). As shown in FIG. 6b, the factor-2 multiplier 25 of FIG. 4 is constructed by means of a diode F and a resistor $R_o$. Resistor $R_o$ is switched in only during the inverted pulse $\tau$. $R_o$ is smaller than the resistance R of the other resistors due to the voltage drop across diode F during the pulse. The control voltage from the output of differential amplifier 26 is fed to loop filter 4.

The advantages of the phase detector according to the present invention are the high reliability of data detection and the small number of components required. Despite the presence of noise or jitter on the flanks of the data, optimum detection is at all times obtained in the middle of the data bit cell because optimum use is made of the clock information present in the data. Moreover, a complete phase measurement is carried out at each flank of the data. The lock-in range of the phase-lock-loop is also improved. Thus, the phase-lock-loop oscillator can have a somewhat greater relative deviation in frequency and yet the loop can still lock. At the same time, the risk of false locking is reduced.

Apart from data transmission, a phase detector of the present invention can also be used for data processing requiring bit synchronization, such as for data storage.

While presently preferred embodiments have been described with particularity and shown in the drawings, the invention may be otherwise embodied within the scope of the appended claims.

What is claimed is:

1. A phase detector for generating a measurement signal, after detection of a flank of a data pulse, which indicates the extent to which the actual distance ($\tau$) between the flank of a data pulse, generated for serial data transmission, and the detection time, determined by a clock signal, differs from a required distance (Tg), and wherein the operation of the phase detector is independent of the duty-cycle of the clock signal, the phase detector comprising:
   (a) an exclusive OR-gate and a first D-flipflop controlled by a clock signal, the data pulse being fed to the D-input of the first D-flipflop and to a first input of the exclusive OR-gate while the output signal of the first D-flipflop functions as a detected data signal and is fed to a second input of the exclusive OR-gate to generate a detection signal at the output of the exclusive OR-gate;
   (b) a second D-flipflop for generating a reference signal whose pulse width is derived from the detection signal and is a measure of the required distance (Tg), having its D-input connected to the output of the exclusive OR-gate and its clock input directly connected to the clock input of the first D-flipflop;
   (c) an adjustment circuit connected to the output of the exclusive OR-gate for varying the amplitude of the detection signal such that the ratio between the amplitude of the reference signal and the amplitude of the adjusted detection signal is equal to Tg/T; and
   (d) a subtraction circuit connected to the adjustment circuit and the second D-flipflop for generating the measurement signal which represents the average value of the difference in amplitude between the adjusted detection signal and the reference signal.

2. A phase detector as described in claim 1 wherein a second adjustment circuit is connected between the output of the second D-flipflop and the subtraction circuit for varying the amplitude of the reference signal.

3. A phase detector for generating a measurement signal, after detection of a flank of a data pulse, which indicates the extent to which the actual distance ($\tau$) between the flank of a data pulse, generated for serial data transmission, and the detection time, determined by a clock signal, differs from a required distance (Tg), and wherein the operation of the phase detector is independent of the duty-cycle of the clock signal, the phase detector comprising:
   (a) an exclusive OR-gate and a first D-flipflop controlled by a clock signal, the data pulse being fed to the D-input of the first D-flipflop and to a first input of the exclusive OR-gate while the output signal of the first D-flipflop functions as a detected data signal and is fed to a second input of the exclusive OR-gate to generate a detection signal at the output of the exclusive OR-gate;
   (b) a second D-flipflop for generating a reference signal whose pulse width is derived from the detection signal and is a measure of the required distance (Tg), having its D-input connected to the output of the exclusive OR-gate and its clock input directly connected to the clock input of the first D-flipflop;
   (c) an adjustment circuit connected to the output of the second D-flipflop for varying the amplitude of the reference signal such that the ratio between the amplitude of the reference signal and the amplitude of the detection signal is equal to Tg/T; and
   (d) a subtraction circuit connected to the adjustment circuit and the exclusive OR-gate for generating the measurement signal which represents the average value of the difference in amplitude between the detection signal and the adjusted reference signal.

* * * * *